United States Patent [19]
Bianchi et al.

[11] Patent Number: 5,635,008
[45] Date of Patent: Jun. 3, 1997

[54] HIGH PRECISION REPLICATION SYSTEM

[75] Inventors: Maurice P. Bianchi, Palos Verdes Estates; James A. Roth; Mark A. Kruer, both of Redondo Beach, all of Calif.

[73] Assignee: TRW Inc., Redondo Beach, Calif.

[21] Appl. No.: 592,746

[22] Filed: Aug. 7, 1995

[51] Int. Cl.$^6$ ............ B32B 31/00; C23C 14/10; B05D 1/00

[52] U.S. Cl. ............ 156/247; 156/249; 156/286; 156/344; 204/192.26; 427/165; 427/527

[58] Field of Search ............ 264/1.9; 427/505, 427/516, 527, 529, 165, 166; 204/192.22, 192.23, 192.26, 192.27, 192.15; 156/286, 285, 247, 249, 344

[56] References Cited

U.S. PATENT DOCUMENTS

| | | | |
|---|---|---|---|
| 4,235,654 | 11/1980 | Dohi et al. | 156/99 |
| 5,160,668 | 11/1992 | Imus | 264/1.7 |
| 5,175,929 | 1/1993 | Anthony et al. | 29/890.142 |
| 5,296,178 | 3/1994 | Sigihara et al. | 264/130 |

*Primary Examiner*—David A. Simmons
*Assistant Examiner*—Jerry Allen Lorengo
*Attorney, Agent, or Firm*—Michael S. Yatsko

[57] ABSTRACT

A high precision replication system creates a nearly atomic level replica. The basic building block of the replication system is a substrate with a smooth replication surface which is to be replicated, and a graded transition layer applied to the replication surface. The graded transition layer comprises a binding material that adheres strongly to the replication surface and a release material that adheres to the replication surface with substantially less force than does the binding material. The portion of the transition layer closest to the substrate comprises predominantly the binding material, and the portion of the transition layer farthest from the substrate comprises predominantly the release material. A separation layer is applied to the transition layer, followed by a coating. The coating provides a backing to the separation layer, acting as structural support to the separation layer. The coating with the separation layer adhered thereto is then separated from the transition layer, thereby providing a high fidelity replica.

33 Claims, 2 Drawing Sheets

HIGH PRECISION REPLICATION SYSTEM

BACKGROUND

This invention relates to a high precision replication system for forming high fidelity replications of a master substrate surface.

The use of a highly polished lenses and mirrors is essential in some high technology systems, such as optical systems and solar panels. For example, in telescopes and microscopes, the efficiency of the optical system depends on the precision of the lens or mirror used in the optics. An imperfect surface leads to light loss due to reflection, and inaccuracies from interference due to uncontrolled refraction.

Similarly, a well polished transparent surface for a solar panel is important for high efficiency. A well polished surface transmits more light with less light loss than does an unpolished, rough surface. For applications such as solar panels for spacecraft, it is extremely important that highly polished, smooth solar panels be used to maximize the energy available to the satellite.

Other applications where highly polished surfaces are useful include sun sensors or star sensors used in spacecraft applications, because a highly polished surface has less reflection of light than a rough surface.

Rather than individually fabricating highly polished surfaces, techniques have been developed to replicate a master surface. Because the cost of labor needed to polish individual lenses or mirrors is extremely high, replication is a cost-effective technique to produce large quantities of very smooth surfaces. Typical of prior art replication systems are those described in U.S. Pat. Nos. 4,235,654 and 5,160,668 (polymer polymerization on a substrate), 5,175,929 (chemical vapor deposition), and 5,296,178 (spraying a high melting point metal). However, typical replication systems typically add defects to a replicand not present in the master. The best replication systems now are able to produce replicands with an RMS smoothness only within 10 to 20 Angstroms of the masters, when the masters have an RMS smoothness of less than 100 Angstroms.

Other disadvantages of conventional replication systems are they can be time-consuming and expensive to use. Another disadvantage of current replication systems is the replicands produced can be relatively thick and heavy. Also, the replicands typically have an RMS smoothness only within 5 to about 20 Angstroms of the masters, which can represent more than 20% error, often time-consuming and expensive polishing is necessary.

For the foregoing reasons, there exists a need for a high precision replication system which can produce replicands close to the smoothness of the master, and preferably with an RMS smoothness within 10 Angstroms of the master when the master has an RMS smoothness of less than 100 Angstroms. In addition, it is preferred that such a system produce low cost and lightweight replicands.

SUMMARY

The present invention is directed to a high precision replication method and system which satisfies this need.

The basic building block of the replication system is a substrate with a smooth upper replication surface, and a graded transition layer applied to the replication surface. The graded transition layer comprises a binding material that adheres strongly to the replication surface and a release material that adheres to the replication surface with substantially less force than does the binding material. The portion of the transition layer closest to the substrate comprises predominantly the binding material, and the portion of the transition layer farthest from the substrate comprises predominantly the release material, with portions therebetween typically comprising both materials.

A separation layer is then applied to the graded transition layer. The separation layer is formed of a material that adheres to the release material of the graded transition layer with less force than the binding material adheres to the replication surface, so the separation layer can be separated from the transition layer.

A coating (or backing) is then applied to the separation layer. The coating provides a backing to the separation layer, acting as structural support for the separation layer.

The coating with the separation layer adhered thereto is then separated from the transition layer, such as by application of a shear force, exposing a high fidelity replica of the smooth supper surface of the substrate. This combination of the separation layer and the coating is a replica of the smooth upper replication surface of the substance, providing an extremely high fidelity copy of the original surface.

The replica produced has such high precision that the replica surface can have almost the same atomic roughness and flatness as the replication master. For example, this invention yields such high precision replication that an original substrate with an RMS smoothness of less than 100 Angstroms can be repeatedly replicated to produce replicas having a smoothness within 10 Angstroms, and even within 5 Angstroms, of the original replication surface.

This high precision is achieved through the use of the graded transition layer, and is contributed to by the use of a sputtering process to apply the different layers to the replication surface. The graded transition layer serves three functions in the system: it adheres strongly to the smooth replication surface; it adheres less securely to the separation layer to allow separation; and it maintains structural integrity during removal of the replica.

Preferably the concentration of the binding material and the concentration of the release material vary gradually from the portion closest to the substrate to the portion closest to the separation layer. Because the proportional concentrations of the binding material and the release material change gradually, a possible slip plane that would result if these two materials are independently applied does not exist.

Preferably the binding material, the release material, and the separation layer have the same crystalline structure.

Preferably a sputtering process is used to apply the transition and separation layers, so a very thin layer of each material can be evenly applied without voids. The use of the sputtering process when applying the binding material and the release material allows the concentration of each material to be varied as the two materials are simultaneously applied.

DRAWINGS

These and other features, aspects, and advantages of the present invention will become better understood with regard to the following description, appended claims, and accompanying drawings where:

DESCRIPTION

Figure 1:
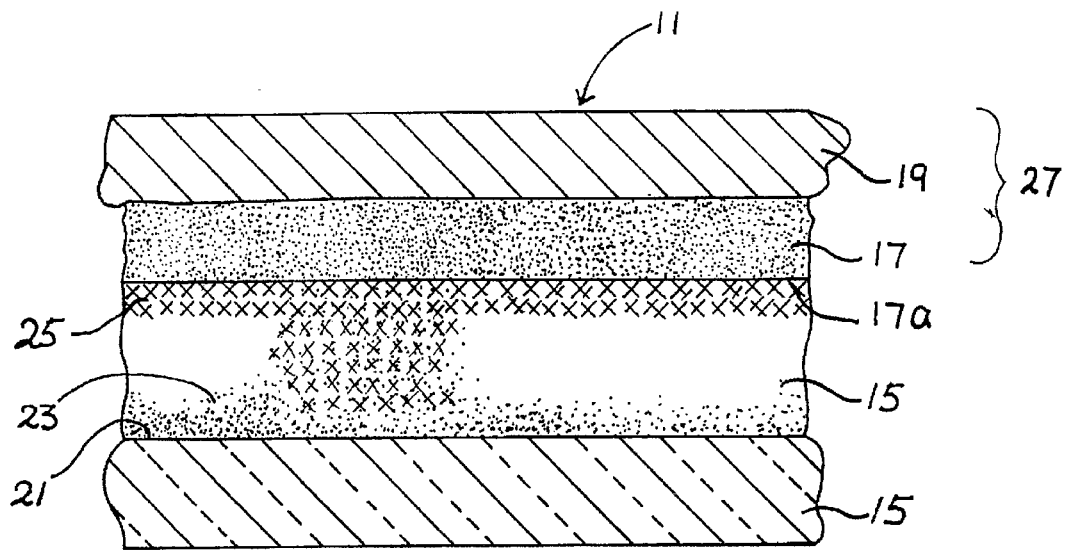
FIG. 1 is a cross-sectional view of a system according to the present invention for high precision replication of a replication surface, showing the various layers used in the system.

This invention is directed to a high precision replication system that is able to replicate a replication surface at the atomic level.

With reference to the figures, a high precision replication system 11 according to the present invention comprises a substrate 13, a graded transition layer 15, a separation layer 17, and a coating 19. The substrate 13 has an upper replication surface 21. For producing high smoothness replicas, the replication surface 21 is highly smooth, having a low RMS smoothness which can be less than 100 Angstroms. However, the invention can be used with relatively rough replication surfaces, when it is not necessary that highly smooth replicas be produced. The layers of the system are not shown to scale in the drawings.

The substrate 13 can be any master, including glass mirrors (made of, for example, silica or alumina), metallic sheets such as aluminum sheets, large crystals, titanium wafers, silicon wafers, germanium wafers, plastic materials, and the like.

The graded transition layer 15 comprises a binding material 23 that adheres strongly to the upper surface 21 of the substrate 13 and a release material 25 that adheres to the upper surface 21 of the substrate 13 with substantially less force than does the binding material 23. The portion of the transition layer 15 closest to the substrate 13 comprises predominantly the binding material 23, and the portion of the transition layer 15 farthest from the substrate 13 comprises predominantly the release material 25, with portions therebetween comprising both the binding material 23 and the release material 25.

The high precision replication system 11 works better if the portion of the transition layer 15 closest to the substrate 13 comprises at least 70% of the binding material 23 and the portion of the transition layer 15 farthest from the substrate 13 comprises at least 70% of the release material 25. The replication system works even better if the portion of the transition layer 15 closest to the substrate 13 comprises at least 80% of the binding material 23 and the portion of the transition layer 15 farthest from the substrate 13 comprises at least 80% of the release material 25. The most preferred approach is to have the portion of the transition layer 15 closest to the substrate 13 comprises about 100% of the binding material 23 and the portion of the transition layer 15 farthest from the substrate 13 comprises about 100% of the release material 25.

The intermediate portion of the transition layer 15 comprises a varying concentration of the binding material 23 and the release material 25. Preferably the concentration of the binding material 23 and the concentration of the release material 25 vary smoothly across the thickness of the transition layer 15.

The thickness of the transition layer 15 can vary. As the thickness of the transition layer 15 increases, it is easier to achieve the desired gradation in concentration of the binding material 23 and the release material 25. However, the precision of the replication decreases. An appropriate balance between ease of fabrication and high precise replication can be achieved with a transition layer having a thickness of from about 200 to about 2,000 Angstroms. Preferably the thickness is no more than about 1,000 Angstroms. A most preferred thickness for the transition layer 15 is from about 350 to about 700 Angstroms.

Preferably the transition layer 15 is applied by the use of the sputtering process. Although physical or chemical vapor deposition techniques can be used, when a sputtering process is used to apply each material, a very thin layer of material can be evenly applied, and more than one material can be applied simultaneously while varying the applied concentration of each material. The ability to gradually and uniformly vary the concentration of the binding material 23 and the release material 25 by sputtering is an important advantage of the use of sputtering technology.

The concentration of each material can be controlled from 0% to 100% while the other material is controlled from 100% to 0% to form a gradual gradation of two materials in the graded transition layer 15. As the power level to a sputter depositing unit that deposits the release material 25 varies from 0% to 100% while the power level to another sputter depositing unit that deposits the binding material 23 varies from 100% to 0%, a gradual gradation of the two materials is simultaneously deposited. The result is that the graded transition layer 15 has about 100% of binding material 23 and about 0% of the release material 25 at the portion closest to the substrate 13, and the graded transition layer 15 that has about 100% of release material 25 and about 0% of the binding material 23 at the portion farthest from the substrate 13.

Proper selection of the binding material 23 and the release material 25 is important, because the transition layer 15 needs to adhere strongly to the surface 21 of the substrate 13 and adhere less securely to the separation layer 17, which is generally comprised of same or similar material as the surface 21 of the substrate 13. This complex function is accomplished by a transition layer 15 that comprises two different materials, the binding material 23 and the release material 25. By selecting a material which adheres strongly to the surface 21 of the substrate 13 as the binding material 23, and by selecting a material which adheres significantly less strongly to the replication surface 21 of the substrate 13 as the release material 25, the challenge is overcome.

In selecting the materials for the transition layer 15, because the thickness of the transition layer 15 is very thin, if the materials chosen are substantially transparent, then the use of the substrate 13 for its intended purpose is generally not affected. This is especially true if the substrate 13 is glass for an optical device.

In selecting the binding material 23 and the release material 25, higher precision can be obtained when both the binding material 23 and the release material 25 have the same crystalline structure as the surface 21 of the substrate 13. A metallic oxide can be used for both or either of the binding material 23 and the release material 25. It is desirable that the release material have a low modulus of elasticity to avoid crack formation. Preferably the modulus of elasticity is less than about $12 \times 10^6$ PSI, and typically is from about $10 \times 10^6$ to about $11 \times 10^6$ PSI. For the same reason, it is desirable that the release material has a Poisson's ratio of from about 0.25 to about 0.4, and preferably from about 0.3 to about 0.35. When the substrate 13 is glass, $SiO_2$ or alumina is preferred as the binding material 23 and ZnS is preferred as the release material 25. Other suitable transparent binding materials 23 include alumina and chromium sesquioxide. Suitable non-transparent binding materials 23 include chromium and titanium.

Because the transition layer 15 is very thin, generally about 1000 Angstroms, when formation of the transition layer 15 is complete, the upper surface 21 of the substrate is replicated on the surface of the transition layer 15.

The separation layer 17 comprises a material selected so that the separation layer 17 adheres to the transition layer 15 with less force than the transition layer 15 adheres to the substrate 13. A preferred material for the separation layer 17 is either a similar material or the same material as the replication surface 21. Better replication is achieved when the material for the separation layer has the same crystalline structure as the crystalline structure of the replication surface 21. Best replication is achieved when the material for the separation layer is the same as the material of the replication surface 21. For example, if the replication surface is glass, the separation layer 17 can be made of quartz. If the replication surface is highly polished aluminum, the separation layer 17 can be made of quartz where a protective quartz layer was previously applied to protect the aluminum.

A preferred method to apply the separation layer 17 onto the transition layer 15 is by the sputtering process, with the separation layer 17 being substantially coextensive with the transition layer 15. The separation layer can be deposited by casting.

To aid in separating the separation layer 17 from the transition layer 15, it is preferred that the separation layer 17 be deposited under compressive stress. Generally a compressive stress of at least about 10 kPSI, measured by any conventional stress gauge, is preferred. If the compressive stress is too high, the separation layer can fracture during separation. Therefore, preferably the compressive stress is no more than about 40 kPSI, and most preferably no more than about 20 kPSI. When sputter depositing the separation layer, the stress level is controlled by controlling the partial pressure of the gas (typically Argon) delivering the sputter material, or the power level of the sputter unit, according to techniques known in the art.

Suitable $SiO_2$ separation layers have been produced by sputter deposition using Argon as the gas with a partial pressure of 3 to 4 mTorr, ambient temperature, a distance between the target and the surface of 6 to 12 inches, and target a power density of about 17.5 watts per square inch.

The separation layer can be any thickness without significantly affecting the precision of the replication system 11. This is because a mirror image of the replication surface 21 is formed on the separation layer 17, between the separation layer 17 and the transition layer 15, which is exposed when the separation layer 17 is separated from the transition layer 15. Therefore, the thickness of the separation layer 17 varies according to the need of the user, and is typically from about 1,000 to about 20,000 Angstroms. Generally, a thickness of less than 1500 Angstroms is used for applications requiring the separated separation layer 17 to transmit as much light as possible, such as for solar panels. Another reason for maintaining the thickness of the separation layer less than about 1500 Angstroms is that a thick separation layer can have stresses that lead to cracks, thereby adversely affecting the smoothness of the replica formed. Transmittance of light can be enhanced by using a substantially transparent material to form the separation layer 17.

The coating 19 applied to the separation layer 17 can be formed of various materials, including thermoplastics such as polycarbonates, polysulphones, acrylics, and polyetherimides; and metals such as aluminum, silver, nickel and gold. The choice of material depends on the application of the replica. The thickness of the coating 19 can vary according to the needs of the user. A sputtering method is preferred for applying metallic coatings 19 to avoid voids between the separation layer 17 and the coating 19. The coating is generally substantially coextensive with the separation layer 17. Thermoplastic and reinforced thermoplastic coatings can be applied by vacuum bagging the system to avoid voids by extracting the trapped air from between the layers and hot melting the coating under elevated temperature. Thermoplastics can also be made into a structural backing by interleaving thermoplastic films with reinforcing materials such as glass, quartz, aromatic polyamide fibers such as Kevlar™ fibers, and graphite fiber based cloths or tapes.

Figure 3:
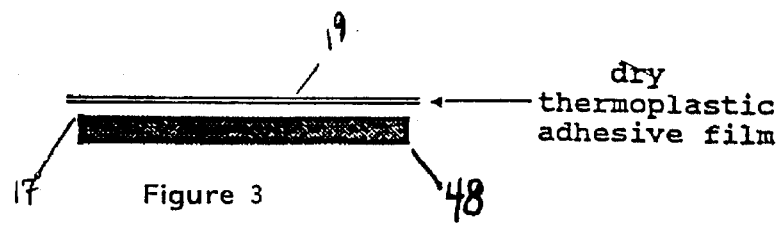
FIGS. 3 through 6 schematically demonstrate sequential steps in applying backing to a separation layer.
Figure 4:
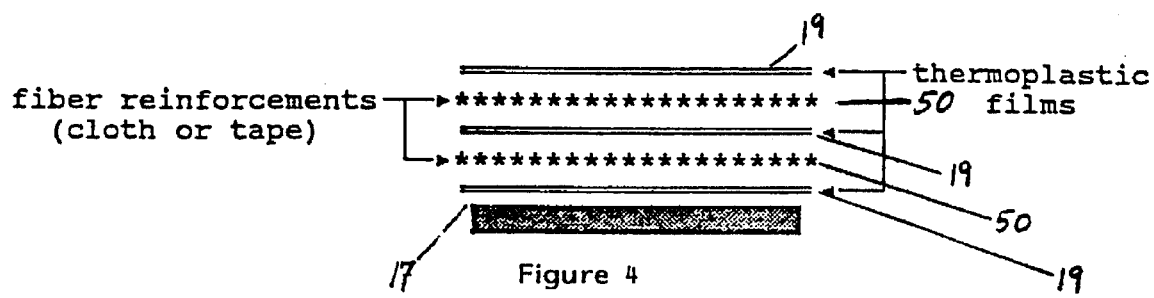
Figure 5:
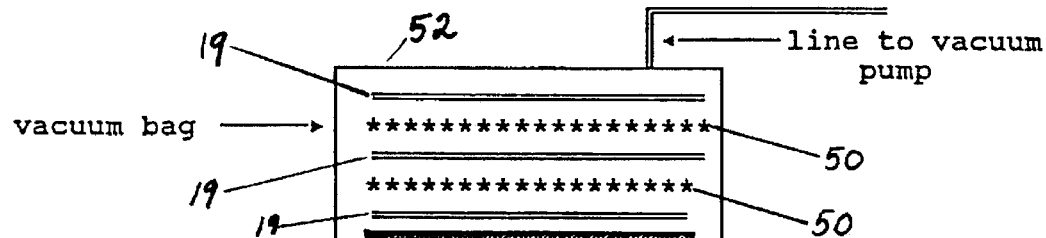

With reference to FIGS. 3–6, a dry, thermoplastic adhesive film 19 was applied to the glass separation layer 17 of an assembly 48 comprising a glass separation layer 17/transition layer 15/substrate 13. As shown in FIG. 4, a reinforced structural backing can be formed by interleaving the adhesive film 19 between plies of dry fiber-based reinforcements 50, such as glass, quartz, graphite, fiber based cloths or tapes, and aromatic polyamide fibers such as Kevlar brand fiber. As shown in FIG. 5, the adhesive 49/reinforcement assembly 48 is then placed under a vacuum bag 52 and evacuated by a vacuum pump (not shown). The vacuum-bagged structure is then placed in an oven 54, shown in FIG. 6, and while under vacuum, heated to a temperature sufficiently high to melt the thermoplastic films 19 and cause them to flow into the interstices of the fiber reinforcement 50 as well as against the back surface of the separation layer 19.

The assembly is then allowed to cool to room temperature while still under vacuum, and then the vacuum is released and the vacuum bag removed. The resulting void-free adhesively bonded, reinforced backed separation layer 17 can then be removed from the original substrate 13.

Figure 6:
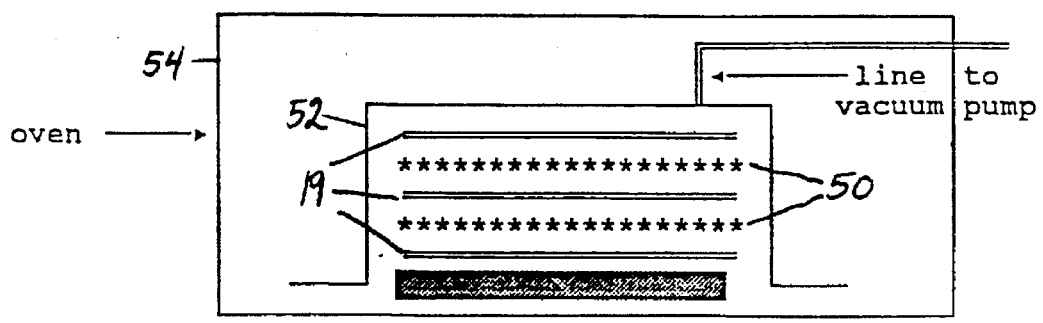

Alternatively, the thermoplastic adhesive film 19 can be used to bond a pre-fabricated reinforced laminate backing using the steps of FIGS. 3, 5, and 6. In addition, other materials such as metals, ceramics and the like can be utilized as the structural backing.

Because the separation layer 17 can be very thin, often less than 1 micron thick, the system 11 can be used to form amorphous solar cells. The system 11 can be used to form a solar cell by applying (i) a layer of photovoltaically active materials (not shown) on the separation layer 17, and (ii) applying a layer of electrically conductive material on the photovoltaically active materials to collect voltage on the layer of photovoltaically active material, before the coating 19 is applied. Suitable photovoltaically active materials include amorphous silicon. Suitable electrically conductive materials include silver, aluminum and gold.

A single replica formed by this method can be used to form an array of solar cells to be used for a solar panel. This can be effected by using a laser to cut and separately form individual small cells. The laser cuts through the layer of photovoltaically active material and/or the layer of conductive material as required, but not through the separation layer 17. Once individual small cells are formed, each individual cell is wired and tested. Thereafter, the coating 19 is applied onto the wiring.

Great efficiency in these solar cells is achieved because the replicated surface of the separation layer 19 is smooth and very thin. The separation layer 19 is made of substantially transparent material which allows most of light to pass through onto the layer of photovoltaically active material. Also when the applied coating 19 is very thin, the solar array formed can be very light and flexible.

Figure 2:
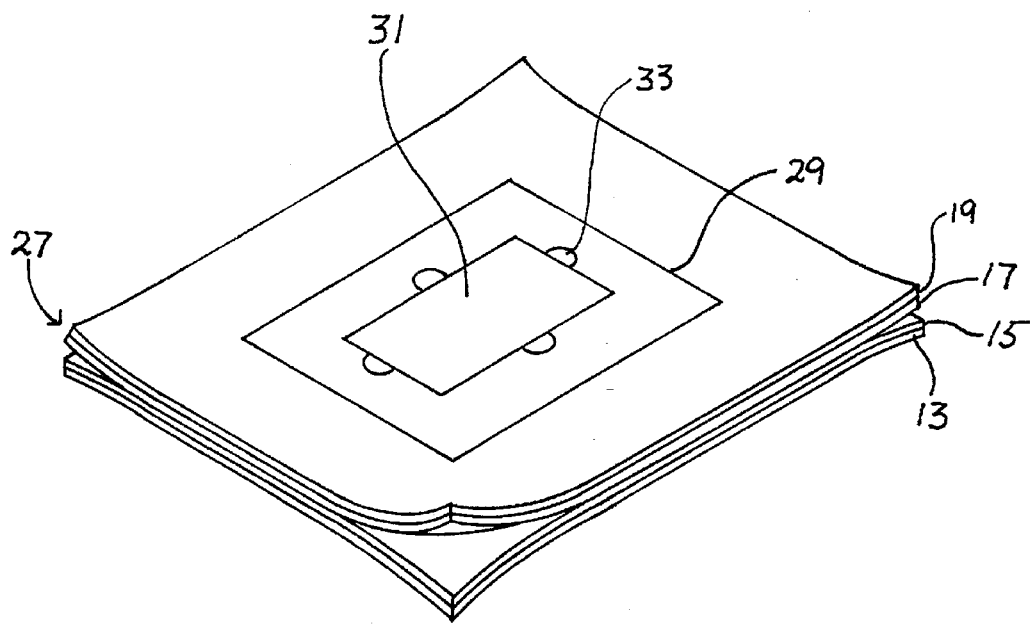
FIG. 2 is a perspective view of a version of the system of FIG. 1 with the replica ready to be separated from the graded transition layer.

FIG. 2 shows the separation layer 17 along with the coating 19 being separated from the transition layer 15 and the substrate 13. When the separation layer 17 and the coating 19 are removed from the transition layer 15, the exposed face 17a of the separation layer 17 now contains a mirror image of the replication surface 21. This separated combination of the separation layer 17 along with the coating 19 forms a replica 27 of the upper surface 21 of the substrate 13.

Separation of the replica 27 from the transition layer 15 can be achieved by first separating the replica 27 from the transition layer 15 around the edges. A flat tool can be used to start the separation around the edges. A shear force is then applied to the replica 27 and the substrate 13 along with the transition layer 15 so the replica 27 slides off the graded transition layer 15.

A void free adhesive 29 can be applied onto the coating 19 and a structural backing 31 attached to the void free adhesive 29, so a pulling force can be applied to the replica 27 along with the shear force to better separate the replica 27 from the transition layer 15. The pulling force can be applied easier if the backing 31 has a plurality of tabs 33 on the sides. The adhesive can be applied by thermal bonding, heat and pressure bonding, or pressure alone. The adhesive can be a curable adhesive such as a dry film epoxy resin or a hot melt thermoplastic film adhesive. Suitable thermoplastic film hot melt adhesives include polycarbonate, acrylic, and polysulphone thermoplastic films. The backing material can be a reinforced thermoplastic or thermoset using glass, quartz, Kevlar, or graphic fiber cloth or tapes.

Although the adhesive 29 and the backing 33 are shown in FIG. 2 as being smaller in surface area than the coating 19, the adhesive 29 and the backing 33 can be coextensive with the coating 19.

A replica 27 manufactured with the system 11 can have such a high precision that the replica 27 surface 17a has nearly the same atomic roughness and flatness as the replication master, the smooth upper surface 21 of the substrate 13. The invention yields such high precision that when an original substrate 13 has an RMS smoothness of less than 100 Angstroms, a replica 27 having a smoothness within 10 Angstroms, and even with 5 Angstroms, of the roughness of the replication surface can be obtained. All RMS smoothness values referred to herein are measured through bidirectional reflection distribution measurements (BRDF). This technique measures smoothness by measuring light scattering from a surface, where white light or laser light is shined at the surface and the amount of light scattered is measured.

Although the present invention has been described in considerable detail with reference to certain preferred versions thereof, other versions are possible. Therefore, the spirit and scope of the appended claims should not be limited to the description of the preferred versions contained herein.

What is claimed is:

1. A method for replicating a replication surface of a substrate comprising the step of applying to the surface a graded transition layer, the transition layer comprising a binding material that adheres strongly to the replication surface and a release material that adheres to the replication surface with substantially less force than does the binding material, the transition layer being applied so that the portion of the transition layer closest to the replication surface comprising predominantly the binding material and the portion of the transition layer farthest from the replication surface comprising predominantly the release material, with portions therebetween comprising both materials.

2. The method of claim 1 wherein the portion of the transition layer closest to the replication surface comprises at least 70% of the binding material and the portion of the transition layer farthest from the substrate comprises at least 70% of the release material.

3. The method of claim 2 wherein the portion of the transition layer closest to the replication surface comprises about 100% of the binding material and the portion of the transition layer farthest from the substrate comprises about 100% of the release material.

4. The method of claim 1 wherein the concentration of the binding material and the concentration of the release material vary smoothly across the thickness of the transition layer.

5. The method of claim 1 wherein the transition layer is less than about 1000 Angstroms thick.

6. The method of claim 1 wherein the step of applying the graded transition layer comprises sputter depositing the binding material and the release material.

7. The method of claim 6 wherein the binding material and the release material are sputter deposited simultaneously.

8. The method of claim 1 wherein the transition layer is substantially transparent.

9. The method of claim 1 or 8 wherein the substrate is glass and the binding material is $SiO_2$.

10. The method of claim 9 wherein the release material is ZnS.

11. The method of claim 1 wherein the release material is ZnS.

12. A method for replicating a replication surface of a substrate comprising the steps of:
   a) applying to the replication surface a graded transition layer, the transition layer comprising a binding material that adheres strongly to the replication surface and a release material that adheres to the replication surface with substantially less force than does the binding material, the transition layer being applied so that the portion of the transition layer closest to the replication surface comprises predominantly the binding material and the portion of the transition layer farthest from the replication surface comprising predominantly the release material, with portions therebetween comprising both materials; and
   b) applying to the transition layer a separation layer, wherein the separation layer is formed of a material that adheres to the release material with less force than the binding material adheres to the replication surface.

13. The invention of claim 12 wherein the transition layer is less than about 1000 Angstroms thick and the separation layer is less than about 1500 Angstroms thick.

14. The invention of claim 12 wherein the transition layer and the separation layer are substantially transparent.

15. The invention of claim 12 wherein the substrate is glass and the binding material is $SiO_2$.

16. The invention of claim 15 wherein the release material is ZnS.

17. The invention substrate of claim 12 wherein the transition layer comprises a metallic oxide.

18. The invention of claim 12 wherein the separation layer has a compression stress of from about 10 to 40 kPSI.

19. A method for forming a replica by replicating a smooth replication surface of a substrate comprising the steps of:
   a) applying to the replication surface a graded transition layer, the transition layer comprising a binding material that adheres strongly to the replication surface and a release material that adheres to the replication surface with substantially less force than does the binding material, the transition layer being applied so that the portion of the transition layer closest to the replication surface comprises predominantly the binding material and the portion of the transition layer farthest from the replication surface comprises predominantly the release material, with portions therebetween comprising both materials;

b) applying to the transition layer a separation layer formed of a material that adheres to the release material with less force than the transition layer adheres to the replication surface;

c) applying to the separation layer a coating; and d) separating the coating with the separation layer adhered thereto from the transition layer to yield the replica.

20. The method of claim 19 wherein the replication surface has an RMS smoothness of less than about 100 Angstroms and the replica has a smoothness within about 10 Angstroms of the smoothness of the replication surface.

21. The method of claim 20 wherein the replication surface has an RMS smoothness of less than about 10 Angstroms and the replica has a smoothness within about 5 Angstroms of the smoothness of the replication surface.

22. The method of claim 19 wherein the transition layer is less than about 1000 Angstroms thick, the separation layer is less than about 1500 Angstroms thick, and the coating is at least 1000 Angstroms thick.

23. The method of claim 19 wherein the step of separating the coating comprises (i) applying to the coating an adhesive, (ii) applying a backing to the adhesive, and (iii) applying a separating force to the backing.

24. The method of claim 23 wherein the adhesive is substantially void free and there are substantially no voids between the adhesive and the backing.

25. A method for forming a replica by replicating a smooth replication surface of a glass substrate comprising the steps of:

a) applying to the replication surface a graded transition layer, the transition layer being substantially transparent, having a thickness of less than about 1000 Angstroms, and comprised of a binding material that adheres strongly to the replication surface and a release material that adheres to the replication surface with substantially less force than does the binding material, the transition layer being applied so that the portion of the transition layer closest to the substrate comprises predominantly the binding material and the portion of the transition layer farthest from the substrate comprises predominantly the release material;

b) applying to the transition layer a substantially transparent separation layer having a thickness of less than about 1500 Angstroms, the transition layer being formed of a material that adheres to the release material with less force than the transition layer adheres to the replication surface;

c) applying to the separation layer a coating at least 1000 Angstroms thick; and d) separating the coating with the separation layer adhered thereto from the transition layer to yield the replica, by (i) applying to the coating a substantially void free adhesive, (ii) applying a backing to the coating, with substantially no voids between the adhesive and the backing, and (iii) applying a sufficient separating force to the backing to separate the separation layer from the transition layer.

26. The method of claim 25 wherein the replication surface has an RMS smoothness of less than about 100 Angstroms and the replica has a smoothness within about 10 Angstroms of the smoothness of the replication surface.

27. The method of claim 26 wherein the replication surface has an RMS smoothness of less than about 10 Angstroms and the replica has a smoothness within about 5 Angstroms of the smoothness of the replication surface.

28. The method of claim 19 or 25 wherein the substrate is glass and the binding material is $SiO_2$.

29. The method of claim 28 wherein the release material is ZnS.

30. The method of claim 19 or 25 wherein the separation layer has a compressive stress of from 10 to 40 kPSI.

31. The method of claim 25 wherein the coating is made of aluminum.

32. The method of claim 19 wherein the step of applying a coating comprises adhering a fiber-reinforced adhesive film to the separation layer.

33. The method of claim 32 wherein the fiber-reinforced adhesive film is adhered to the separation layer by the steps of:

(i) applying a fiber-reinforced adhesive film to the separation layer;

(ii) applying a vacuum to the separation layer and film; and (iii) heating the adhesive film while under vacuum to temperatures sufficiently high to melt the adhesive thermoplastic film.

* * * * *